United States Patent
Otremba et al.

(10) Patent No.: US 8,618,644 B2
(45) Date of Patent: Dec. 31, 2013

(54) ELECTRONIC DEVICE AND MANUFACTURING THEREOF

(75) Inventors: Ralf Otremba, Kaufbeuren (DE); Marco Seibt, Villach (AT); Uwe Kirchner, Feldkirchen (AT); Wolfgang Peinhopf, Viktring (AT); Michael Treu, Villach (AT); Andreas Schloegl, Ottobrunn (DE); Mario Veldvoss, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/594,949

(22) Filed: Aug. 27, 2012

(65) Prior Publication Data

US 2012/0319109 A1    Dec. 20, 2012

Related U.S. Application Data

(62) Division of application No. 12/035,598, filed on Feb. 22, 2008, now Pat. No. 8,253,225.

(51) Int. Cl.
*H01L 23/02* (2006.01)

(52) U.S. Cl.
USPC .............. 257/678; 257/735; 257/E23.014

(58) Field of Classification Search
USPC .................... 257/693, 696, 692; D13/182
See application file for complete search history.

(56) References Cited

U.S. PATENT DOCUMENTS

| | | | |
|---|---|---|---|
| 4,546,374 A | 10/1985 | Olsen et al. |
| 5,399,905 A | 3/1995 | Honda et al. |
| 6,307,272 B1 | 10/2001 | Takahashi et al. |
| 6,329,707 B1 | 12/2001 | Hayasi |
| 6,667,547 B2 | 12/2003 | Woodworth et al. |
| 7,514,778 B2 | 4/2009 | Otremba et al. |
| 2004/0026770 A1 | 2/2004 | Tsuchida et al. |

FOREIGN PATENT DOCUMENTS

| | | |
|---|---|---|
| DE | 19920381 | 12/1999 |
| DE | 10017383 | 3/2001 |
| DE | 10303933 | 8/2005 |
| DE | 102004047306 | 4/2006 |
| EP | 1079434 | 2/2001 |
| JP | 06132468 | 5/1994 |

OTHER PUBLICATIONS

Non-Final Office Action mailed May 24, 2010 in U.S. Appl. No. 12/035,598.
Final Office Action mailed Feb. 29, 2012 in U.S. Appl. No. 12/035,598.

*Primary Examiner* — Eva Yan Montalvo
(74) *Attorney, Agent, or Firm* — Dicke, Billig & Czaja, PLLC

(57) ABSTRACT

An electronic device and manufacturing thereof. One embodiment provides a semiconductor chip having a control electrode and a first load electrode on a first surface and a second load electrode on a second surface. A first lead is electrically coupled to the control electrode. A second lead is electrically coupled to the first load electrode. A third lead is electrically coupled to the first load electrode, the third lead being separate from the second lead. A fourth lead is electrically coupled to the second load electrode, the second and third leads being arranged between the first and fourth leads.

15 Claims, 7 Drawing Sheets

ELECTRONIC DEVICE AND MANUFACTURING THEREOF

CROSS-REFERENCE TO RELATED APPLICATIONS

This Utility patent application is a divisional application of U.S. application Ser. No. 12/035,598, filed Feb. 22, 2008, which is incorporated herein by reference.

BACKGROUND

This invention relates to an electronic device and a method of manufacturing thereof.

Power semiconductor chips may, for example, be integrated into electronic devices. Power semiconductor chips are suitable, in one embodiment, for the switching or control of currents and/or voltages. Power semiconductor chips may, for example, be implemented as power MOSFETs, IGBTs, JFETs or power bipolar transistors.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
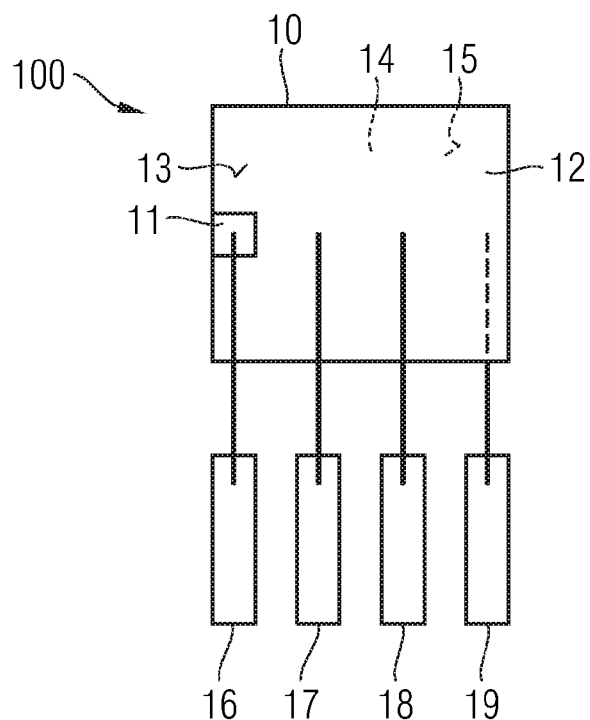
FIG. 1 schematically illustrates a device 100 as an exemplary embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Devices with semiconductor chips are described below. The semiconductor chips may be of extremely different types and may include for example integrated electrical or electro-optical circuits. The semiconductor chips may, for example, be configured as power semiconductor chips, such as power MOSFETs (Metal Oxide Semiconductor Field Effect Transistors), IGBTs (Insulated Gate Bipolar Transistors), JFETs (Junction Gate Field Effect Transistors) or power bipolar transistors. Furthermore, the semiconductor chips may include control circuits, microprocessors or microelectromechanical components. In one embodiment, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements in one embodiment on its two main surfaces, that is to say on its top side and bottom side. In one embodiment, power semiconductor chips may have a vertical structure. By way of example, the source electrode and gate electrode of a power MOSFET may be situated on one main surface, while the drain electrode of the power MOSFET is arranged on the other main surface. Furthermore, the devices described below may include integrated circuits to control the integrated circuits of other semiconductor chips, for example the integrated circuits of power semiconductor chips. The semiconductor chips need not be manufactured from specific semiconductor material, for example Si, SiC, SiGe, GaAs, and, furthermore, may contain inorganic and/or organic materials that are not semiconductors, such as for example insulators, plastics or metals. Moreover, the semiconductor chips may be packaged or unpackaged.

The semiconductor chips have electrodes (or contact pads) which allow electrical contact to be made with the integrated circuits included in the semiconductor chips. One or more metal layers may be applied to the electrodes of the semiconductor chips. The metal layers may be manufactured with any desired geometric shape and any desired material composition. The metal layers may, for example, be in the form of a layer covering an area. Any desired metal or metal alloy, for example aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible.

The semiconductor chips may be mounted on carriers. The carrier may be of any shape, size or material. During the fabrication of the devices the carrier may be provided in a way that other carriers are arranged in the vicinity and are connected by connection means to the carrier with the purpose of separating the carriers. The carrier may be fabricated from metals or metal alloys, in one embodiment copper, copper alloys, iron nickel, aluminum, aluminum alloys, or other materials. It may further be electrically conductive. Furthermore, the carrier may be plated with an electrically conductive material, for example copper, silver, iron nickel or nickel phosphorus. The carrier may be, for example, a leadframe or a part of a leadframe, such as a die pad, or a metallic clip or any other rigid substrate. The carrier or a part of it may be bent, for example in an S-shaped manner. This may allow the carrier to connect two surfaces having different heights.

The devices described below include external contact elements, which may be of any shape and size. The external contact elements may be accessible from outside the device and may thus allow electrical contact to be made with the semiconductor chips from outside the device. Furthermore, the external contact elements may be thermally conductive and may serve as heat sinks for dissipating the heat generated by the semiconductor chips. The external contact elements may be composed of any desired electrically conductive material, for example of a metal, such as copper, aluminum or gold, a metal alloy or an electrically conductive organic material. The external contact elements may be leads of a leadframe.

The devices may include a mold material covering at least parts of the components of the devices. The mold material may be any appropriate thermoplastic or thermosetting material. Various techniques may be employed to cover the components with the mold material, for example compression molding, injection molding, powder molding or liquid molding.

FIG. 1 schematically illustrates a device 100 including a semiconductor chip 10 having a control electrode 11 and a first load electrode 12 located on a first surface 13 and a second load electrode 14 located on a second surface 15 opposite to the first surface 13. Since FIG. 1 illustrates a top view of the device 100, the second load electrode 14 and the second surface 15 of the semiconductor chip 10 are not visible. Further, the device 100 includes a first lead 16 electrically coupled to the control electrode 11, a second lead 17 electrically coupled to the first load electrode 12, a third lead 18 electrically coupled to the first load electrode 12, and a fourth lead 19 electrically coupled to the second load electrode 14. The second lead 17 is separate from the third lead 18. Thus, the second and third leads 17 and 18 are individual, discrete leads and are not formed integrally. Moreover, at least one the second and third leads 17 and 18 is arranged between the first and fourth leads 16 and 19. The other one of the second and third leads 17 and 18 may also be arranged between the first and fourth leads 16 and 19 as illustrated in FIG. 1, but may be arranged somewhere else.

Figure 2:
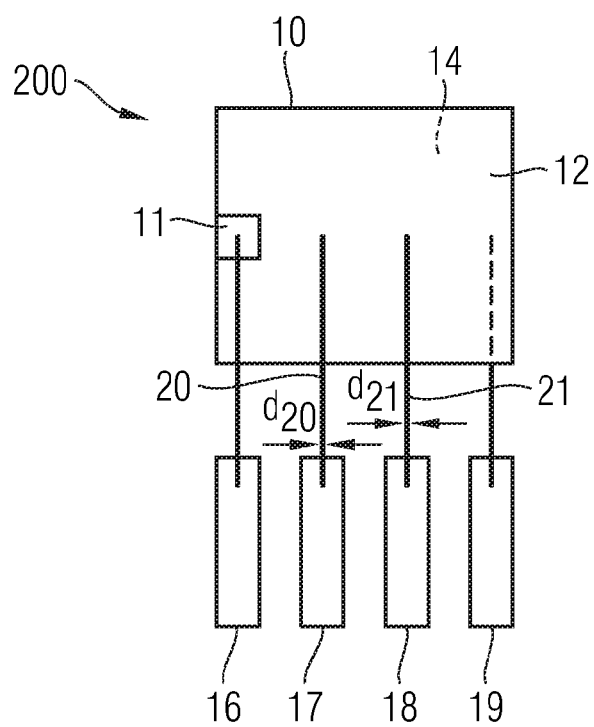
FIG. 2 schematically illustrates a device 200 as a further exemplary embodiment.

FIG. 2 schematically illustrates a device 200 including components similar or identical to the components of the device 100. Therefore similar or identical components of the devices 100 and 200 are denoted by the same reference numerals. In the device 200, one or more first wires 20 are used to electrically couple the second lead 17 to the first load electrode 12, and one or more second wires 21 are used to electrically couple the third lead 18 to the first load electrode 12. The thickness $d_{20}$ of the first wires is smaller than the thickness $d_{21}$ of the second wires 21. In FIG. 2 the second and third leads 17 and 18 are arranged between the first and fourth leads 16 and 19. In one embodiment, it is possible that one of the second and third leads 17 and 18 is not arranged between the first and fourth leads 16 and 19, but at another location.

Figure 3:
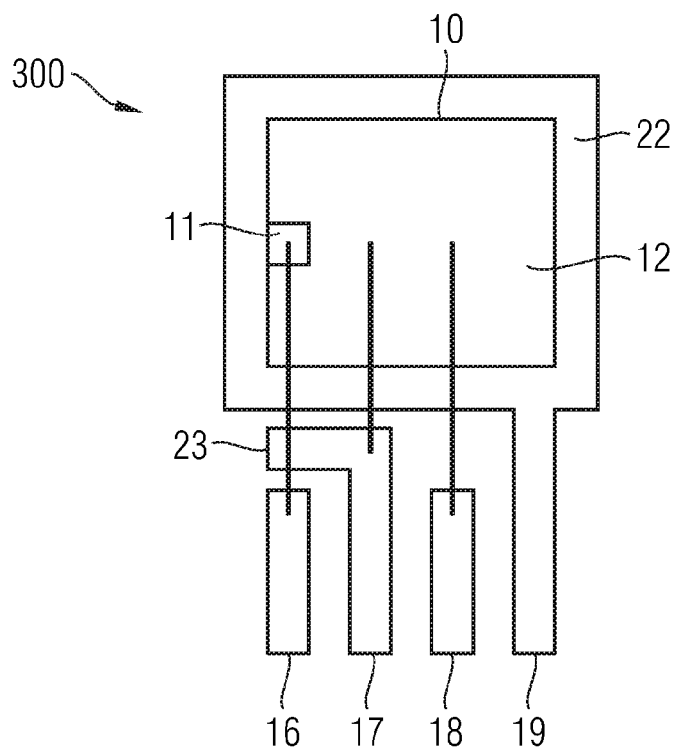
FIG. 3 schematically illustrates a device 300 as a further exemplary embodiment.

FIG. 3 schematically illustrates a device 300. Again, components similar or identical to the components of the device 100 are denoted by the same reference numerals. The device 300 includes a carrier 22, on which the semiconductor chip 10 is mounted with its second surface 15 facing the carrier 22. Furthermore, at least a part 23 of the second lead 17 is arranged between the first lead 16 and the carrier 22. Although the third lead 18 is arranged between the first and fourth leads 16 and 19 in FIG. 3, the third lead 18 may be arranged at another location. Moreover, the fourth lead 19 is contiguous with the carrier 22. Instead of being made in one piece, the carrier 22 and the fourth lead 19 may also be separate.

Figure 4:
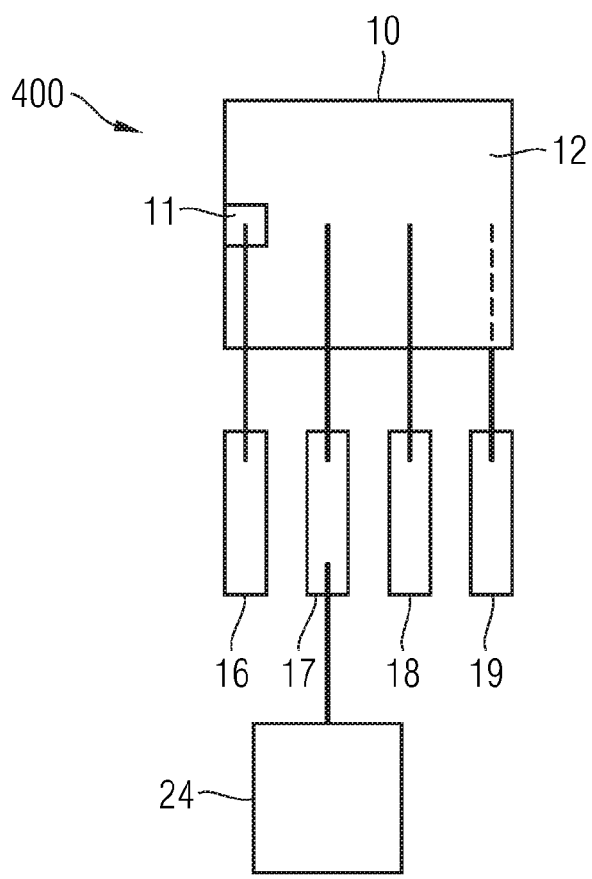
FIG. 4 schematically illustrates a device 400 as a further exemplary embodiment.

FIG. 4 schematically illustrates a device 400 including components similar or identical to the components of the device 100 and thus denoted by the same reference numerals. The device 400 further includes a voltage measuring unit 24 electrically coupled to the second lead 17. In FIG. 4 the second and third leads 17 and 18 are arranged between the first and fourth leads 16 and 19. In one embodiment, it is possible that one of the second and third leads 17 and 18 is not arranged between the first and fourth leads 16 and 19, but at another location.

Figure 5A:
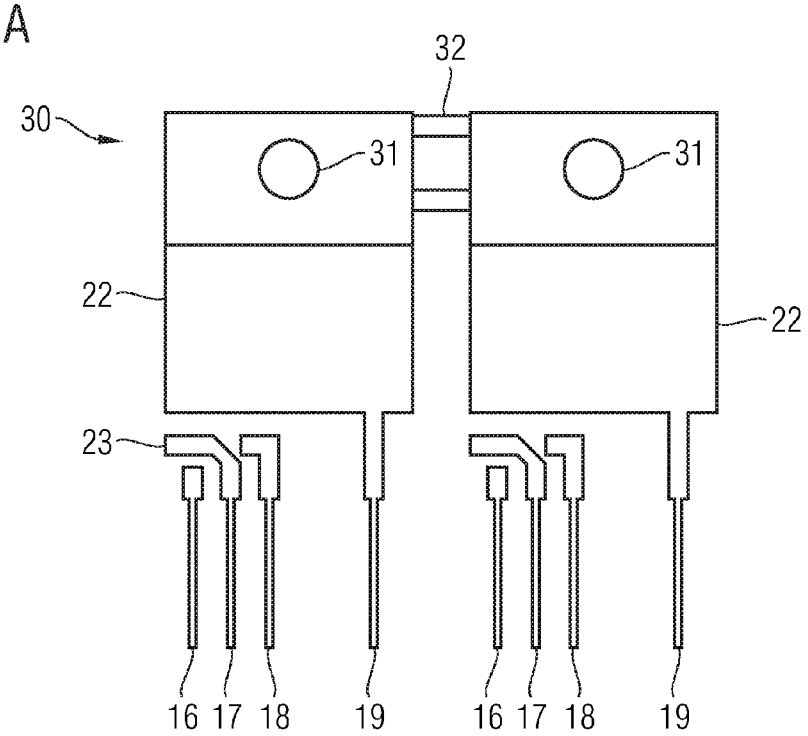
FIGS. 5A to 5F schematically illustrate an exemplary embodiment of a method to fabricate a device 500.
Figure 5B:
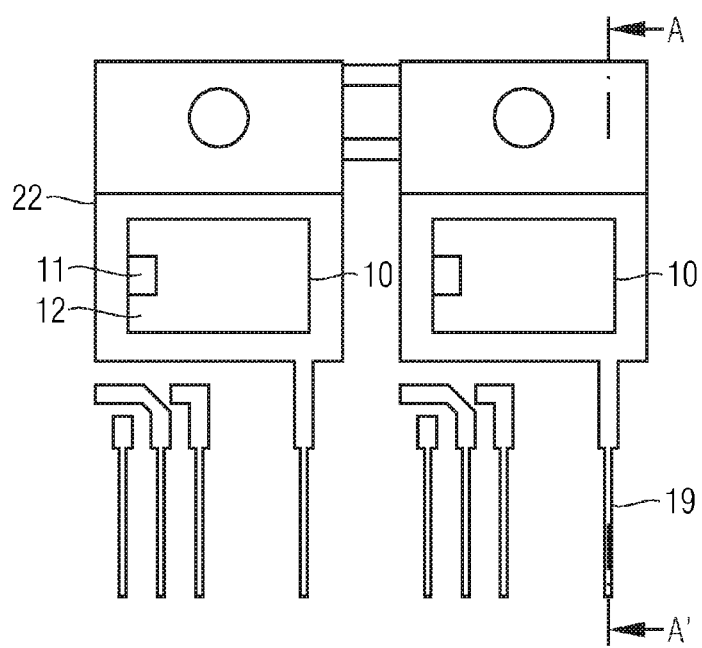
Figure 5C:
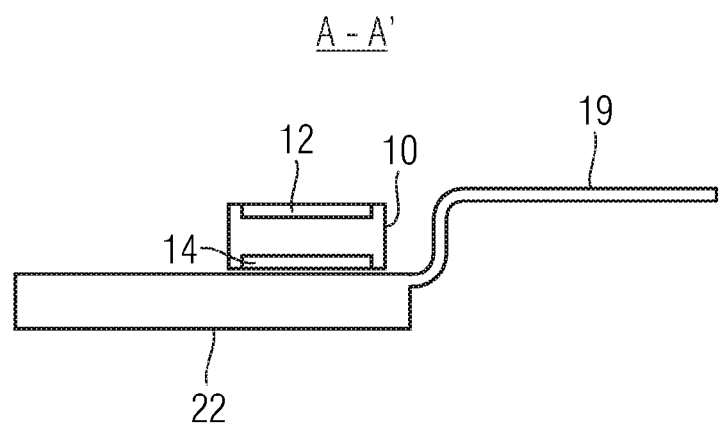
Figure 5D:
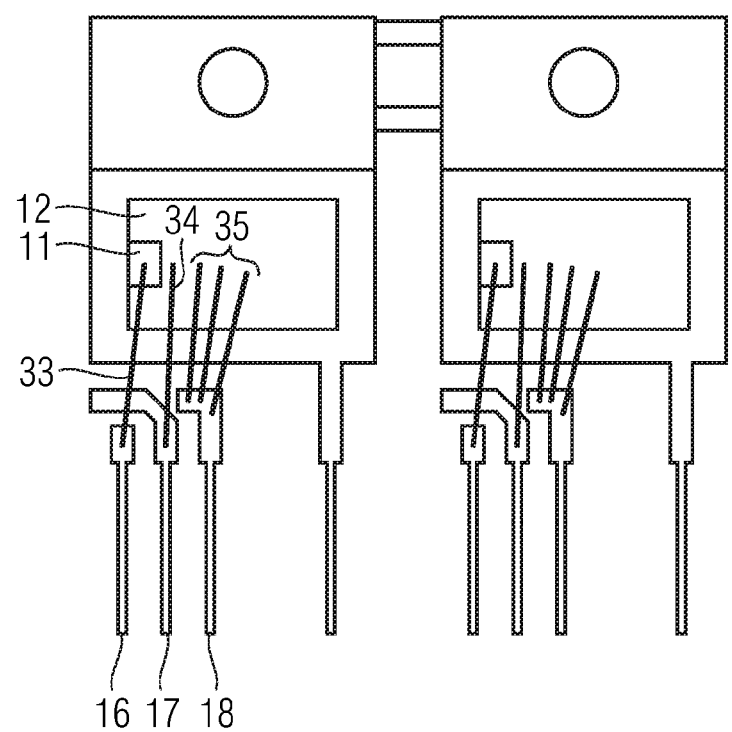
Figure 5E:
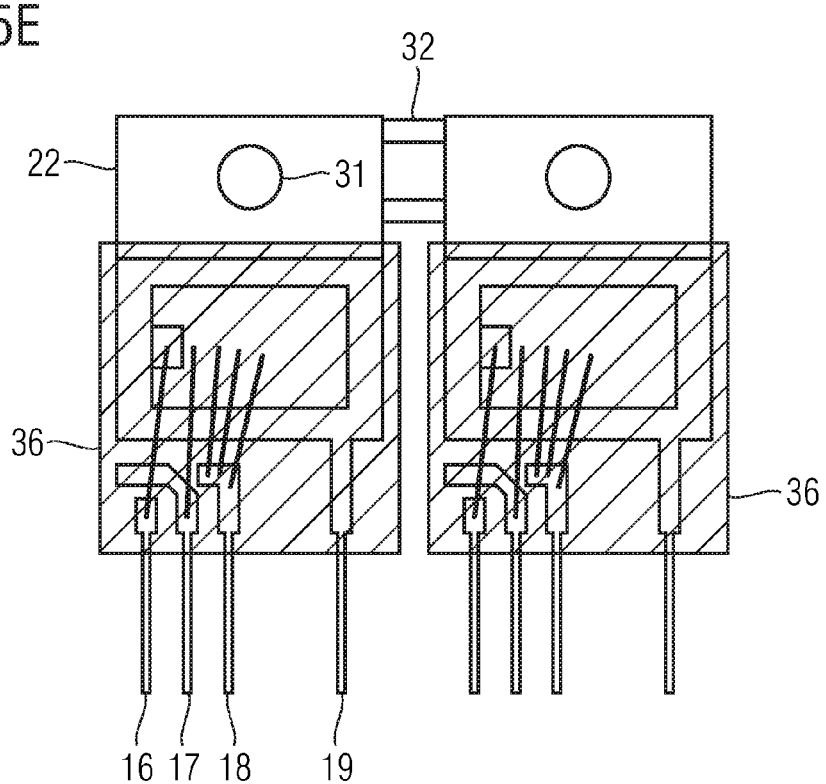
Figure 5F:
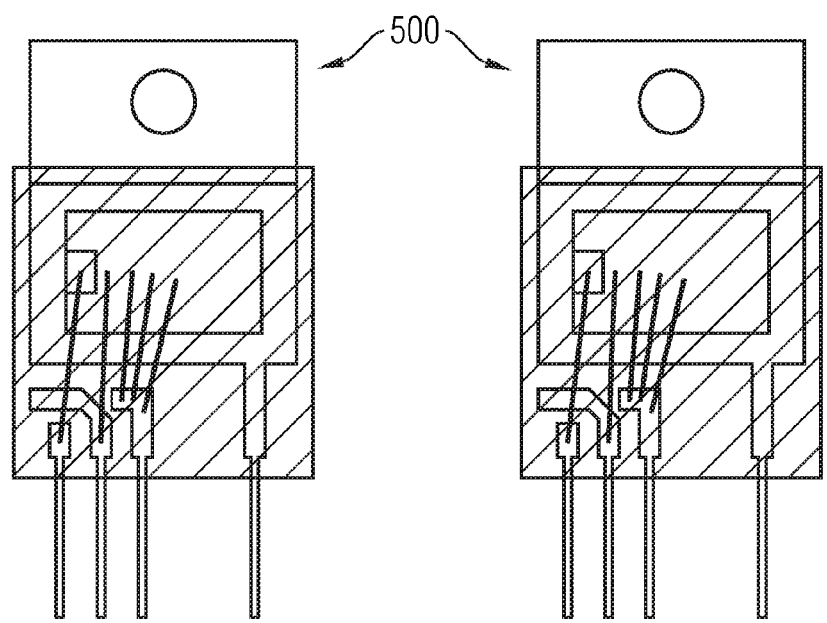

FIGS. 5A to 5F schematically illustrate a method for production of a device 500, which is illustrated in FIG. 5F. The device 500 is an implementation of the devices 100 to 300 illustrated in FIGS. 1 to 3. The features of the device 500 that are described below can therefore be likewise applied to the devices 100 to 300.

As illustrated in FIG. 5A, a leadframe 30 is provided. The leadframe 30 may include a plurality of carriers 22, two of them are illustrated in FIG. 5A. A mounting hole 31 may be provided on each of the carriers 22 to be used for mounting the devices 500 on a circuit board. Furthermore, four leads 16 to 19 are assigned to each of the carriers 22. The leads 16 to 19 may protrude essentially in parallel from one side of the carrier 22. The first to third leads 16 to 18 may be located on one side of the fourth lead 19, for example on the left side of the fourth lead 19 as illustrated in FIG. 5A. Each of the leads 16 to 19 may have a wire pad on the end thereof. The distance between the fourth lead 19 and the third lead 18 adjacent to the fourth lead 19 may be greater than the distances between the leads 16 to 18, respectively. For example, the distance between the third and fourth leads 18 and 19 may be in the range from 1.5 to 2.5 mm. The distances between the leads 16 to 18 may be in the range from 0.2 to 0.8 mm, respectively. The fourth lead 19 may be contiguous with one side of the carrier 22. Furthermore, the second lead 17 adjacent to the first lead 16 may be structured such that the part 23 of the second lead 17 is placed between the first lead 16 and the carrier 22. For example, the second lead 17 and in one embodiment the third lead 18 may be L-shaped. The carriers 22 and the leads 16 to 19 may be linked by dams (tie bars) 32. For reasons of clarity, only two of the dams 32 are illustrated in FIG. 5A.

The leadframe 30 may be manufactured from metals or metal alloys, in one embodiment copper, copper alloys, iron nickel, aluminum, aluminum alloys, or other electrically conductive materials. Furthermore, the leadframe 30 may be plated with an electrically conductive material, for example copper, silver, iron nickel or nickel phosphorus. The shape of the leadframe 30 is not limited to any size or geometric shape. The leadframe 30 may have been manufactured by punching a metal plate.

As illustrated in FIG. 5B, two semiconductor chips 10 are placed over the carriers 22. Further semiconductor chips 10 may also be placed over further carriers 22 of the leadframe 30 (not illustrated in FIG. 5B). The semiconductor chips 10 may have been fabricated on a wafer made of semiconductor material. The semiconductor chips 10 may have been manufactured on the same wafer, but may have been manufactured on different wafers. Furthermore, the semiconductor chips 10 may be physically identical, but may also contain different integrated circuits.

The semiconductor chips 10 may be mounted onto the carriers 22 with their second surfaces 15 facing the carriers 22. The semiconductor chips 10 may be configured as power semiconductor chips, for example power MOSFETs, IGBTs, JFETs or power bipolar transistors. In the case of a power MOSFET or a JFET, the control electrode 11 is a gate electrode, the first load electrode 12 is a source electrode and the second load electrode 14 is a drain electrode. In the case of an IGBT, the control electrode 11 is a gate electrode, the first load electrode 12 is an emitter electrode and the second load electrode 14 is a collector electrode. In the case of a power bipolar transistor, the control electrode 11 is a base electrode, the first load electrode 12 is an emitter electrode and the second load electrode 14 is a collector electrode.

FIG. 5C illustrates the semiconductor chip 10 mounted on the carrier 22 in cross section along the line A-A' depicted in FIG. 5B. The second load electrode 14 may be electrically coupled to the carrier 22 by diffusion soldering. For that, a solder material may be deposited on the second load electrode 14 or the upper surface of the carrier 22 (not illustrated), for example by sputtering or other appropriate physical or chemical deposition methods. The solder material may have a thickness in the range from 100 nm to 10 μm, in one embodiment in the range from 1 to 3 μm. During the soldering operation, the solder material diffuses into the adjacent materials which leads to an intermetallic phase at the interface between the semiconductor chip 10 and the carrier 22. The solder material may, for example, consist of AuSn, AgSn, CuSn, Sn, AuIn, AgIn, AuSi or CuIn.

For producing the soldered joint, the leadframe 30 may be heated by a hot plate to a temperature above the melting point of the solder material, for example in the range from 200 to 400° C., in one embodiment in the range from 330 to 350° C. In one embodiment, both the leadframe 30 and the semiconductor chips 10 may be placed in an oven and heated to an appropriate temperature. A pick-and-place tool may be used capable of picking the semiconductor chips 10 and placing them on the heated carriers 22. During the soldering process the semiconductor chips 10 may be pressed onto the carriers 22 for an appropriate time in the range from 10 to 200 ms, in one embodiment around 50 ms.

Instead of a diffusion soldering process, other connection techniques may be used to attach the semiconductor chips 10 to the carriers 22, for example soft soldering or adhesive bonding by using an electrically conductive adhesive. When using a soft soldering process to join the semiconductor chips 10 and the carriers 22 to each other, solder material remains at the interfaces between the semiconductor chips 10 and the carriers 22 after the soldering process has been finished. In case of adhesive bonding, an electrically conductive adhesive may be used, which may be based on filled or unfilled polyimides, epoxy resins, acrylate resins, silicone resins or mixtures thereof and may be enriched with gold, silver, nickel or copper in order to produce electrical conductivity.

As illustrated in FIG. 5C, the fourth lead 19, which is contiguous which the carrier 22, may be bent in S-shape to form a step.

After the attachment of the semiconductor chips 10 to the carriers 22, electrical interconnections may be established from the control electrodes 11 and the first load electrodes 12 situated on the first surfaces 13 of the semiconductor chips 10 to the leads 16 to 18 (see FIG. 5D). These interconnections may be made by wire bonding. For example, ball bonding or wedge bonding may be used as the interconnect technique. The bond wires may be made up of gold, aluminum, copper or any other appropriate electrically conductive material. One or more bond wires 33 may be attached to electrically couple the control electrode 11 to the first lead 16. One or more bond wires 34 may be attached to electrically couple the first load electrode 12 to the second lead 17, and one or more bond wires 35 may be attached to electrically couple the first load electrode 12 to the third lead 18.

It may be provided that the thickness (diameter) of the bond wires 33 and/or 34 is smaller than the thickness (diameter) of the bond wires 35. For example, the thickness of the bond wires 33 and/or 34 may be in the range from 10 to 110 μm and in one embodiment smaller than 100 μm. The thickness of the bond wires 35 may be in the range from 110 to 500 μm and in one embodiment greater than 120 μm.

As alternatives to wire bonding, other interconnect techniques may be used. For example, metallic clips may be placed on the semiconductor chips 10 and the leads 16 to 18 in order to establish the electrical connections described above.

A mold transfer process may be carried out to encapsulate the components arranged on the leadframe 30 with a mold material 36 (see FIG. 5E). The mold material 36 may encapsulate any portion of the device 500, but leaves at least parts of the leads 16 to 19 uncovered. The exposed parts of the leads 16 to 19 may be used as external contact elements to electrically couple the device 500 to other components, for example a circuit board, such as a PCB (Printed Circuit Board). Furthermore, parts of the carriers 22, for example their backsides and/or the mounting holes 31, may be left uncovered by the mold material 36. On the exposed surfaces of the device 500 a heat sink or cooling element may be attached in order to dissipate the heat generated by the semiconductor chip 10 during operation.

The mold material 36 may be composed of any appropriate electrically insulating thermoplastic or thermosetting material, in one embodiment it may be composed of a material commonly used in contemporary semiconductor packaging technology. Various techniques may be employed to cover the components of the device 500 with the mold material 36, for example compression molding, injection molding, powder molding or liquid molding.

Before or after the encapsulation with the mold material 36, the individual devices 500 are separated from one another by separation of the leadframe 30, for example by sawing the dams 32 (see FIG. 5F).

During operation of the device 500, the second lead 17 may be used to measure the electrical potential at the first load electrode 12 versus a reference potential, for example ground potential. For that purpose, a voltage measuring unit may be coupled to the second lead 17 (not illustrated in FIG. 5F). The voltage measuring unit may be designed such that only a small current or no current flows through the bond wire 34 and the second lead 17. The larger the current flowing through the bond wire 34 and the second lead 17, the larger the voltage drop caused by this current which would detract from correctly sensing the voltage at the first load electrode 12. For example, the internal resistance of the voltage measuring unit may be chosen such that only a small current or no current flows through the bond wire 34 and the second lead 17. The drain-source current may flow through the bond wires 35 and the third lead 18.

Due to the arrangement of the leads 16 to 19, the gate-drain capacitance is reduced (in case the semiconductor chip 10 is a power MOSFET). One reason is the large distance between the first lead 16, which is coupled to the gate electrode 11, and the fourth lead 19, which is coupled to the drain electrode 14. This also implies that the distance between the gate and drain pads arranged on the circuit board may be large thus further reducing the gate-drain capacitance. Another reason is that the second and third leads 17 and 18 (or at least one of the leads 17 and 18) shield the first lead 16 from the fourth lead 19. Furthermore, the part 23 of the second lead 17, which is arranged between the first lead 16 and the carrier 22, may also help to reduce the gate-drain capacitance because the carrier 22 is also at drain potential. A high gate-drain capacitance may lead to unwanted effects, for example unwanted oscillating behavior of the device 500.

The voltage applied between the first and second load electrodes 12 and 14 may be up to 1000 V. The switching frequency applied to the control electrode 11 may be in the range from 100 kHz to 1 MHz, but may also be outside this range.

It is obvious to a person skilled in the art that the devices 100, 200, 300 and 500 illustrated in FIGS. 1, 2, 3 and 5F are only intended to be exemplary embodiments, and many variations are possible. For example, the arrangement of the leads 16 to 19 may be varied as illustrated schematically in FIGS. 6 to 8. For reasons of clarity, the mold material 36 is not illustrated in FIGS. 6 to 8.

Figure 6:
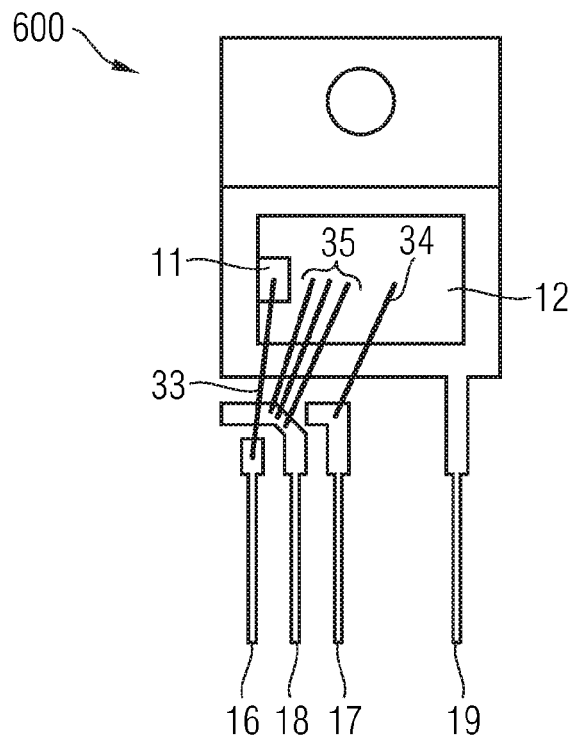
FIG. 6 schematically illustrates a device 600 as a further exemplary embodiment.

In the device 600 illustrated in FIG. 6, the positions of the second and third leads 17 and 18 are exchanged when compared to the device 500 illustrated in FIG. 5D. The third lead 18, which is used to transfer the current to or from the first load electrode 12, is arranged adjacent to the first lead 16, which is coupled to the control electrode 11. The second lead 17, which is used to measure the electrical potential at the first load electrode 12, is arranged between the third lead 18 and the fourth lead 19. In the device 600, the third lead 18 is L-shaped to shield the first lead 16 from the carrier 22.

Figure 7:
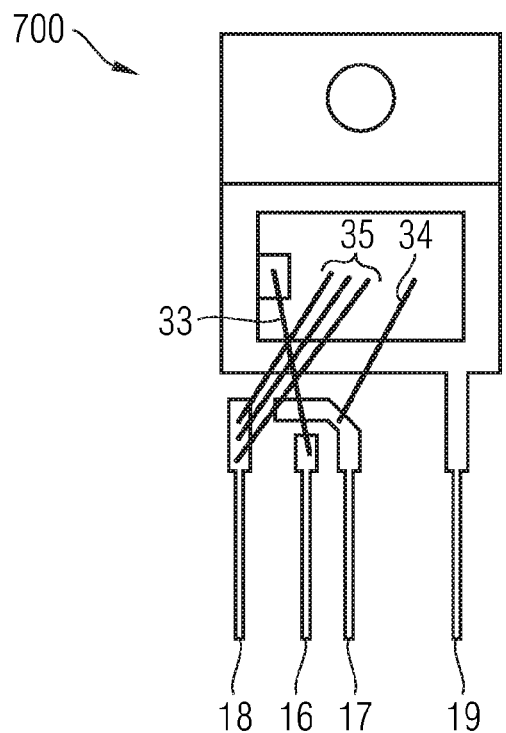
FIG. 7 schematically illustrates a device 700 as a further exemplary embodiment.

Another variation of the device 500 is illustrated in FIG. 7. In the device 700 illustrated there the third lead 18 is not arranged between the first and fourth leads 16 and 19. To the contrary, the first and second leads 16 and 17 are arranged between the third and fourth leads 18 and 19. Although the bond wires 33 and 35 are crossing in FIG. 7, they are not connected.

Figure 8:
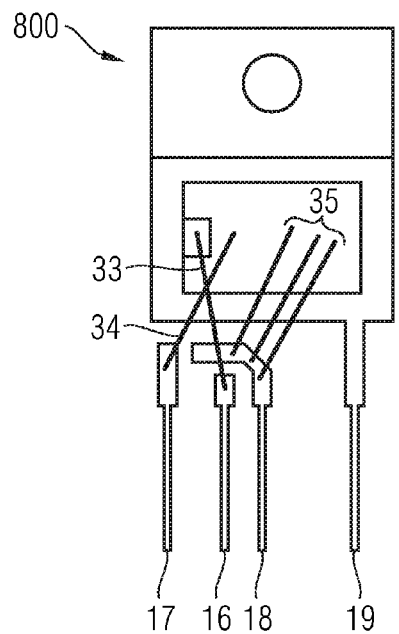
FIG. 8 schematically illustrates a device 800 as a further exemplary embodiment.

A variation of the device 700 is the device 800 illustrated in FIG. 8. There, the first and third leads 16 and 18 are arranged between the second and fourth lead 17 and 19. The second lead 17 is used to measure the potential at the first load electrode 12, and the third lead 18 is used to transfer the current to or from the first load electrode 12. In the device 800, the third lead 18 is L-shaped to shield the first lead 16 from the carrier 22. Although the bond wires 33 and 34 are crossing in FIG. 8, they are not connected.

Figure 9:
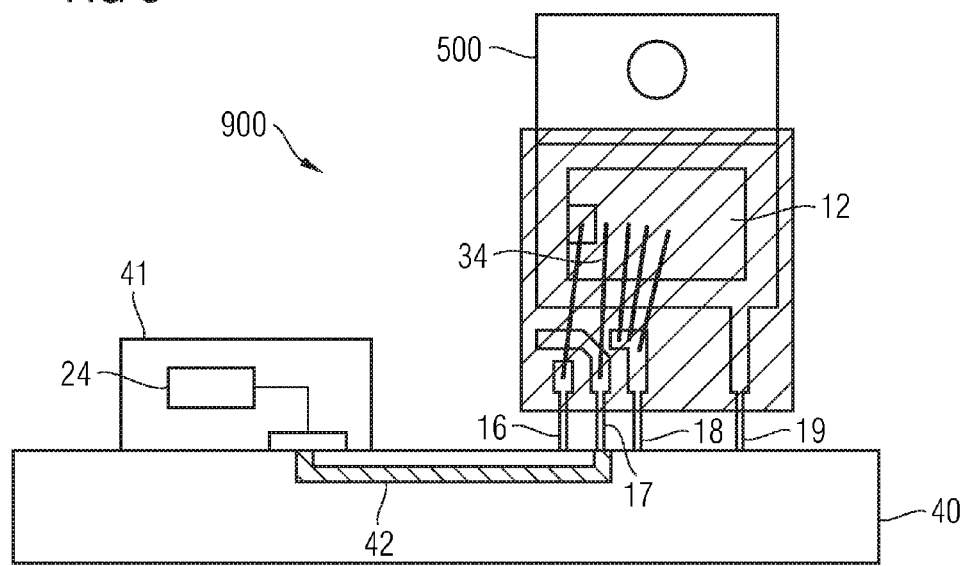
FIG. 9 schematically illustrates a device 900 as a further exemplary embodiment.

FIG. 9 schematically illustrates a device 900 which is an implementation of the device 400 illustrated in FIG. 4. The features of the device 900 that are described below can therefore be likewise applied to the device 400.

The device 900 includes a circuit board 40, for example a PCB (Printed Circuit Board). The device 500 is mounted on the circuit board 40. Solder deposits may have been used to solder the leads 16 to 19 to contact pads of the circuit board 40 (not illustrated). Furthermore, a semiconductor chip 41 is mounted on the circuit board 40. The semiconductor chip 41 includes the voltage measuring unit 24. An electrical connection 42 is used to electrical couple the second lead 17 to the voltage measuring unit 24 included in the semiconductor chip 41. The voltage measuring unit 24 may have an internal resistance that is high enough so that only a small current or no current flows through the bond wire 34, the second lead 17 and the electrical connection 42. This may allow the voltage measuring unit 24 to measure the electrode potential at the first load electrode 12 accurately. The load current may flow through the third and fourth leads 18 and 19. Instead of the device 500, the devices 600 to 800 may be implemented in the device 900. The electrical potential measured at the first load electrode 12 may be used for various purposes, for example for controlling the control electrode 11.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device comprising:
    a first semiconductor chip having a control electrode and a first load electrode on a first surface and a second load electrode on a second surface opposite to the first surface;
    a first lead electrically coupled to the control electrode;
    a second lead electrically coupled to the first load electrode;
    a third lead electrically coupled to the first load electrode;
    a fourth lead electrically coupled to the second load electrode, at least one of the second and third leads being arranged between the first and fourth leads; and
    a voltage measuring unit electrically coupled to the second lead,
    wherein the voltage measuring unit is integrated into a second semiconductor chip.

2. The device of claim wherein the first and second semiconductor chips are placed over a circuit board.

3. The device of claim 1, wherein the first semiconductor chip is placed over a carrier with its second surface facing the carrier.

4. The device of claim 3, wherein the fourth lead is contiguous with the carrier.

5. The device of claim 3, wherein at least a part of the second lead is arranged between the first lead and the carrier.

6. The device of claim 3, wherein at least a part of the third lead is arranged between the first lead and the carrier.

7. The device of claim 6, wherein the second lead is L-shaped.

8. The device of claim 1, wherein the distance between the fourth lead and the lead adjacent to the fourth lead is greater than the distances between the first, second and third leads.

9. A device comprising:
a carrier;
a semiconductor chip having a control electrode and a first load electrode on a first surface and a second load electrode on a second surface opposite to the first surface, the semiconductor chip being placed over the carrier with its second surface facing the carrier;
a first lead electrically coupled to the control electrode;
a second lead electrically coupled to the first load electrode, at least a part of the second lead being arranged between the first lead and the carrier;
a third lead electrically coupled to the first load electrode; and
a fourth lead contiguous with the carrier, at least one of the second and third leads being arranged between the first and fourth leads,
wherein the second lead is arranged between the first and fourth leads, and
wherein the first lead is arranged between the second and third leads.

10. The device of claim 9, comprising:
a voltage measuring unit electrically coupled to the second lead.

11. The device of claim 9, wherein the distance between the fourth lead and the lead adjacent to the fourth lead is greater than the distances between the first, second and third leads.

12. A device comprising:
a carrier;
a semiconductor chip having a control electrode and a first load electrode on a first surface and a second load electrode on a second surface opposite to the first surface, the semiconductor chip being placed over the carrier with its second surface facing the carrier;
a first lead electrically coupled to the control electrode;
a second lead electrically coupled to the first load electrode;
a third lead electrically coupled to the first load electrode, at least a part of the third lead being arranged between the first lead and the carrier; and
a fourth lead contiguous with the carrier, at least one of the second and third leads being arranged between the first and fourth leads,
wherein the third lead is arranged between the first and fourth leads, and
wherein the first lead is arranged between the second and third leads.

13. The device of claim 12, comprising:
a voltage measuring unit electrically coupled to the second lead.

14. The device of claim 12, wherein the second lead is L-shaped.

15. The device of claim 12, wherein the distance between the fourth lead and the lead adjacent to the fourth lead is greater than the distances between the first, second and third leads.

* * * * *

UNITED STATES PATENT AND TRADEMARK OFFICE
CERTIFICATE OF CORRECTION

| | |
|---|---|
| PATENT NO. | : 8,618,644 B2 |
| APPLICATION NO. | : 13/594949 |
| DATED | : December 31, 2013 |
| INVENTOR(S) | : Otremba et al. |

It is certified that error appears in the above-identified patent and that said Letters Patent is hereby corrected as shown below:

Title Page, Item (75), inventor name delete "Mario Veldvoss" and insert in place thereof --Mario Feldvoss--.

In the Claims:
Column 8, line 52, delete "claim" and insert in place thereof --claim 1--.

Signed and Sealed this
Twenty-fourth Day of June, 2014

Michelle K. Lee
*Deputy Director of the United States Patent and Trademark Office*